(12) United States Patent
Someya et al.

(10) Patent No.: US 11,963,433 B2
(45) Date of Patent: Apr. 16, 2024

(54) ORGANIC ELECTROLUMINESCENT ELEMENT

(71) Applicants: THE UNIVERSITY OF TOKYO, Tokyo (JP); NIPPON HOSO KYOKAI, Tokyo (JP); NIPPON SHOKUBAI CO., LTD., Osaka (JP)

(72) Inventors: Takao Someya, Tokyo (JP); Tomoyuki Yokota, Tokyo (JP); Hirohiko Fukagawa, Tokyo (JP); Takahisa Shimizu, Tokyo (JP); Katsuyuki Morii, Osaka (JP); Tsuyoshi Goya, Osaka (JP); Kenji Kuwada, Osaka (JP)

(73) Assignees: The University of Tokyo, Tokyo (JP); Nippon Hoso Kyokai, Tokyo (JP); Nippon Shokubai Co., Ltd., Osaka (JP)

( * ) Notice: Subject to any disclaimer, the term of this patent is extended or adjusted under 35 U.S.C. 154(b) by 415 days.

(21) Appl. No.: 17/414,762

(22) PCT Filed: Dec. 6, 2019

(86) PCT No.: PCT/JP2019/047812
§ 371 (c)(1),
(2) Date: Jun. 16, 2021

(87) PCT Pub. No.: WO2020/129702
PCT Pub. Date: Jun. 25, 2020

(65) Prior Publication Data
US 2022/0069220 A1    Mar. 3, 2022

(30) Foreign Application Priority Data

Dec. 21, 2018    (JP) .................................. 2018-240122

(51) Int. Cl.
*H01L 33/00*    (2010.01)
*H10K 71/40*    (2023.01)
(Continued)

(52) U.S. Cl.
CPC ............. *H10K 71/80* (2023.02); *H10K 71/40* (2023.02); *H10K 71/00* (2023.02)

(58) Field of Classification Search
None
See application file for complete search history.

(56) References Cited

U.S. PATENT DOCUMENTS

2011/0081504 A1* 4/2011 Gersdorff .............. C23C 14/228
427/585
2015/0182758 A1    7/2015 Ajiki
2016/0233447 A1    8/2016 Kim et al.

FOREIGN PATENT DOCUMENTS

CN         104600202       5/2015
JP         2015-142717     8/2015
(Continued)

OTHER PUBLICATIONS

Yokota, et al., "Ultraflexible organic photonic skin", Sci, Adv. 2016; 2 (4), e1501856, 9 pages.
(Continued)

*Primary Examiner* — Bradley Smith
(74) *Attorney, Agent, or Firm* — HSML P.C.

(57) ABSTRACT

The present invention provides an organic electroluminescence device capable of having not only a device lifetime comparable to that of an existing organic electroluminescence device but also a small thickness of smaller than 10 μm and excellent flexibility. The present invention relates to an organic electroluminescence device having a structure including: an anode; a cathode on a substrate; and a laminate of multiple layers between the anode and the cathode, the device having a thickness of smaller than 10 μm.

16 Claims, 3 Drawing Sheets

(51) Int. Cl.
*H10K 71/80* (2023.01)
*H10K 71/00* (2023.01)

(56) References Cited

FOREIGN PATENT DOCUMENTS

JP        2016-076484      5/2016
KR     10-2018-0106718   10/2018

OTHER PUBLICATIONS

Fukagawa, et al., Long-Lived Flexible Displays Employing Efficient and Stable Inverted Organic Light-Emitting Diodes, Advanced Materials, 2018, 30, 1706768, 7 pages.

White, et al., "Ultrathin, higly flexible and stretchable PLEDs", Nature Photonics—Advance Online Publication, Jul. 28, 2013, 6 pages.

Kim, et al., "Highly Transparent and Flexible Organic Light-Emitting Diodes with Structure Optimized for Anode/Cathode Multilayer Electrodes", Advanced Functional Materials, 2015, 25, 7145-7153.

Kim, et al., "Dissolvable films of silk fibroin for ultrathin conformal bio-integrated electronics", Nature Materials, vol. 9, Jun. 2010, pp. 511-517.

Yin, et al., "Two-Dimensional Stretchable Organic Light-Emitting Devices with High Efficiency", Applied Materials & Interfaces, 2016, 8, 31166-31171.

Choi, et al., "Flexible active-matrix organic light-emitting diode display enabled by MoS2 thin-film transistor", Science Advances, 2018; 4: eaas8721, 9 pages.

Kim, et al., "Ultrathin Quantum Dot Display Integrated with Wearable Electronics", Advanced Materials 2017, 29, 1700217, 6 pages.

* cited by examiner

Device 51,52

Device 53

ORGANIC ELECTROLUMINESCENT ELEMENT

TECHNICAL FIELD

The present invention relates to organic electroluminescence devices. Specifically, the present invention relates to an organic electroluminescence device that can be used for a display device such as a display unit of an electronic device, a lighting system, and the like.

BACKGROUND ART

Display devices including organic electroluminescence devices are capable of providing display with higher brightness and higher definition, and they also have better features such as a wider viewing angle than liquid crystal display devices. Thus, organic electroluminescence devices are expected to be widely used for displays of TVs and mobiles and lighting systems. Also, organic electroluminescence devices, which are thin, soft, and flexible, have been considered to be used for other applications by making use of such features. For example, a method has been proposed in which cosmetic effects or therapeutic effects are achieved by activating the skin by spreading a sheet containing an organic electroluminescence element on the skin and applying light (see Patent Literature 1 and Non-Patent Literature 1). Organic electroluminescence devices having smaller thicknesses and improved softness have been actively studied, and organic electroluminescence devices with excellent flexibility and ultra-thin organic electroluminescence devices have been reported (see Non-Patent Literatures 2 to 4).

CITATION LIST

Patent Literature
Patent Literature 1: JP 2015-142717 A
Non-Patent Literature
Non-Patent Literature 1: Tomoyuki Yokota and nine others, "Science Advances", 2016, Vol. 2, e1501856
Non-Patent Literature 2: Matthew S. White and fifteen others, "Nature photonics", 2013, Vol. 188, DOI:10.1038
Non-Patent Literature 3: Dong-Young Kim and four others, "Materials Views", 2015, Vol. 25, pp. 7145-7153
Non-Patent Literature 4: Dae-Hyeong Kim and sixteen others, "Nature Materials", 2010, Vol. 9, pp. 511-517

SUMMARY OF INVENTION

Technical Problem

The features of being thin, soft, and flexible are not found in liquid crystal display devices currently widely used, and these features are important in expanding the use of organic electroluminescence devices and developing new applications. In the above-mentioned applications where a sheet containing an organic electroluminescence device is spread on the skin, devices having a smaller thickness and excellent flexibility have also been required because a thinner and more flexible sheet can provide less discomfort during attachment to the skin. In addition, the device lifetime is an important factor to maintain emission for the required time. The devices described in Non-Patent Literatures 2 and 3 are excellent in thinness and flexibility, but they are not sealed and have a short lifetime. A sealed device has an improved lifetime, but has a large thickness, leading to reduced flexibility. As described above, existing devices have room for improvement in terms of achieving thinness, flexibility, and a lifetime together. Further, from the viewpoint of thinness, the thickness of the device is required to be sufficiently small so as to follow any curvilinear surface as described in Non-Patent Literature 4. Specifically, the device has a thickness of smaller than 10 µm. If possible, the thickness is required to be 3 µm or smaller.

The present invention has been made in view of such a current state of the art and aims to provide an organic electroluminescence device capable of having not only a device lifetime comparable to that of an existing organic electroluminescence device but also a small thickness of smaller than 10 µm and excellent flexibility.

Solution to Problem

The present inventors examined organic electroluminescence devices capable of having not only a device lifetime comparable to that of an existing organic electroluminescence device but also excellent thinness and flexibility and found that a so-called inverted organic electroluminescence device having a structure including an ultra-thin film substrate, a cathode on the substrate, an anode, and a laminate of multiple layers between the cathode and the anode can provide an organic electroluminescence device capable of having not only a device lifetime comparable to that of an existing organic electroluminescence device but also a thickness of smaller than 10 µm and excellent flexibility. Thereby, the present invention has been made.

That is, the present invention relates to an organic electroluminescence device having a structure including:
  an anode;
  a cathode on a substrate; and
  a laminate of multiple layers between the anode and the cathode,
  the device having a thickness of smaller than 10 µm.
  Preferably, the substrate is a single layer.
  Preferably, the substrate is a single layer of a para-xylylene-based polymer film.
  Preferably, the organic electroluminescence device includes a metal oxide layer between the anode and the cathode.

The present invention also relates to a display device including the organic electroluminescence device of the present invention.

The present invention also relates to a lighting system including the organic electroluminescence device of the present invention.

Advantageous Effects of Invention

The organic electroluminescence device of the present invention having not only a device lifetime comparable to that of an existing organic electroluminescence device but also a smaller thickness and excellent flexibility can be suitably used in various applications. For example, the device of the present invention can be used for display devices such as displays of TVs and mobiles and lighting systems or can be used by attaching it to the skin for cosmetic effects and therapeutic effects.

DESCRIPTION OF EMBODIMENTS

Figure 1:
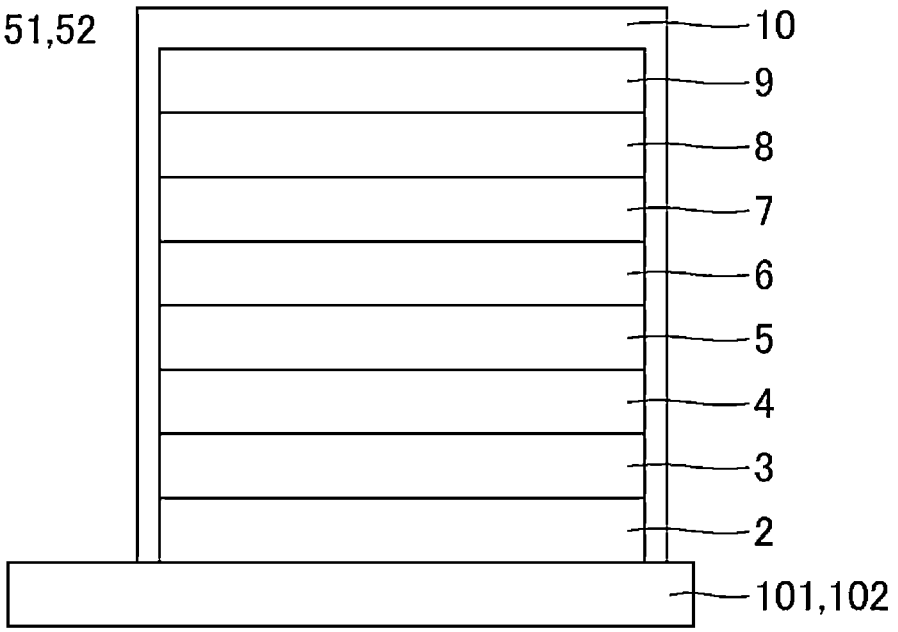
FIG. 1 is a schematic view showing an exemplary organic electroluminescence device of the present invention.
Figure 2:
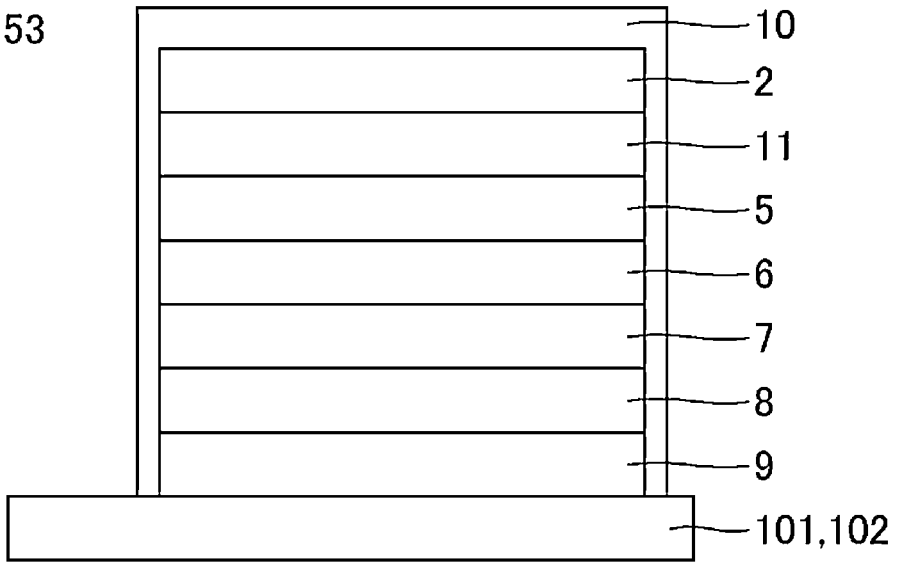
FIG. 2 is a schematic view showing an organic electroluminescence device of Comparative Example 1.

The present invention is described in detail below.

A combination of two or more of individual preferred embodiments of the present invention described below is also a preferred embodiment of the present invention.

The organic electroluminescence device of the present invention is an inverted organic electroluminescence device having a thickness of smaller than 10 µm.

A common organic electroluminescence device has a so-called conventional structure in which a laminate of multiple layers is present between a cathode and an anode on a substrate. A conventional organic electroluminescence device is susceptible to degradation by oxygen or water and is required to be tightly sealed. Such a device requires an inorganic layer having a certain thickness consisting of multiple layers. In response to this, a substrate having a thickness of 100 µm or greater has been commonly used to secure barrier properties and to secure the lifetime. In contrast, an inverted organic electroluminescence device, which has higher resistance to oxygen or water than a conventional organic electroluminescence device, requires few barrier layers. The barrier layer, if present, may be a single and thin layer. Thus, a thinner substrate can be used. The organic electroluminescence device of the present invention including a combination of such an inverted organic electroluminescence device and an ultra-thin substrate that can achieve a total thickness of the device of smaller than 10 µm can have not only a device lifetime comparable to that of an existing organic electroluminescence device but also excellent thinner and flexibility.

The following describes a substrate for use in the organic electroluminescence device of the present invention, followed by description of the components of the organic electroluminescence device other than the substrate.

<Substrate>

The organic electroluminescence device of the present invention includes a substrate having a thickness of smaller than 10 µm. The thickness is preferably 3 µm or smaller, more preferably 1 µm or smaller. In order to provide a device that is easy to handle in its production process, the thickness of the substrate is preferably 1 nm or greater. The thickness of the substrate can be measured with a quartz crystal film thickness meter or a stylus profiler or by spectroscopic ellipsometry.

The substrate is preferably a single layer. This is because if the substrate is an ultra-thin film consisting of a laminate of multiple layers, it is easily curled due to the different thermal expansion coefficients of the layers and its small thickness, for example, and is difficult to be kept in a flat film state. The single layer substrate is more easily kept in a flat film state than a laminate film.

The substrate of the organic electroluminescence device of the present invention may be made of any material. The material may be an organic material or inorganic material. In order to easily form an ultra-thin substrate, an organic material is preferred. Examples of the organic material include a polymer such as polyethylene terephthalate, polyethylene naphthalate, polypropylene, a cycloolefin polymer, a polyamide, a polyimide, polyethersulfone, polymethyl methacrylate, polycarbonate, polyacrylate, or a para-xylylene-based polymer (parylene, registered trademark of Parylene Japan, LLC) containing a structural unit represented by the following formula (1):

[Chem. 1]

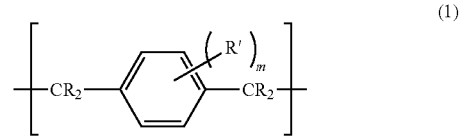

(1)

(wherein R is a hydrogen atom or halogen atom; R' is a halogen atom or monovalent organic group as a substituent of an aromatic ring; and m is 0 to 4) and a photoresist material. Examples of the photoresist material include epoxy resin photoresist materials (e.g., SU-8).

Parylene is particularly preferred among these.

In the formula (1), m is 0 to 4, preferably 0 to 2.

Examples of the monovalent organic group in the formula (1) include C1-C20 linear or branched alkyl groups such as methyl, ethyl, propyl, isopropyl, butyl, isobutyl, and tert-butyl groups; C1-C20 haloalkyl groups such as fluoromethyl, difluoromethyl, and trifluoromethyl groups; C5-C7 cyclic alkyl groups such as cyclopentyl, cyclohexyl, and cycloheptyl groups; C1-C20 linear or branched alkoxy groups such as methoxy, ethoxy, propoxy, isopropoxy, butoxy, isobutoxy, tert-butoxy, pentyloxy, hexyloxy, heptyloxy, and octyloxy groups; a nitro group; a cyano group; C1-C10 alkyl-containing dialkylamino groups such as methylamino, ethylamino, dimethylamino, and diethylamino groups; diarylamino groups such as diphenylamino and carbazolyl groups; acyl groups such as acetyl, propionyl, and butyryl groups; C2-C30 alkenyl groups such as vinyl, 1-propenyl, allyl, and styryl groups; C2-C30 alkynyl groups such as ethynyl, 1-propynyl, and propargyl groups; aryl groups optionally substituted with a halogen atom or a group such as an alkyl, alkoxy, alkenyl, or alkynyl group; heterocyclic groups optionally substituted with a halogen atom or a group such as an alkyl, alkoxy, alkenyl, or alkynyl group; N,N-dialkylcarbamoyl groups such as N,N-dimethylcarbamoyl and N,N-diethylcarbamoyl groups; and dioxaborolanyl, stannyl, silyl, ester, formyl, thioether, epoxy, and isocyanate groups.

The para-xylylene-based polymer may consist of a structural unit represented by the formula (1) or may contain other structural units. The structural unit represented by the formula (1) is preferably present in a proportion of 95 mol % or more based on 100 mol % of all structural units of the para-xylylene-based polymer. The proportion is more preferably 98 mol % or more, still more preferably 99 mol % or more.

The substrate is preferably made of a polymer having a weight average molecular weight of 1000 to 1000000. The polymer having such a molecular weight provides a film with high strength and stability. The weight average molecular weight is more preferably 100000 to 1000000, still more preferably 500000 to 1000000.

The weight average molecular weight of the para-xylylene-based polymer can be measured by gel permeation chromatography (GPC).

<Structure Other than Substrate>

The organic electroluminescence device of the present invention includes a cathode on a substrate, an anode, and one or more organic compound layers between the cathode and the anode. The organic compound layer(s) include(s) an emitting layer and optional other layers such as an electron transport layer and a hole transport layer.

The organic electroluminescence device of the present invention is preferably an organic-inorganic hybrid organic electroluminescence device further including a metal oxide layer between the cathode and the anode. Use of a metal oxide as a material can provide an organic electroluminescence device having higher resistance to oxygen and water.

Preferably, the organic electroluminescence device of the present invention is an organic-inorganic hybrid organic electroluminescence device in which the cathode is adjacent to the substrate and the metal oxide layer is present between the anode and the cathode, an electron injection layer and the optional electron transport layer are present between the cathode and the emitting layer, and the hole transport layer and/or a hole injection layer are/is present between the anode and the emitting layer. The organic electroluminescence device of the present invention may further include other layer(s) between any of these layers. Still, the device preferably consists of only these layers. In other words, preferably, in the device, the cathode, the electron injection layer, the optional electron transport layer, the emitting layer, the hole transport layer and/or the hole injection layer, and the anode are stacked adjacent to each other in the stated order. Each of these layers may consist of one layer or two or more layers. In the device of the present invention, the electron injection layer or the electron transport layer may consist of an organic buffer layer or may include an organic buffer layer as a part.

When the organic electroluminescence device having the above structure includes no electron transport layer, the electron injection layer and the emitting layer are adjacent to each other. When the device includes either the hole transport layer or hole injection layer, the layer is stacked adjacent to the emitting layer and the anode. When the device includes both the hole transport layer and the hole injection layer, the emitting layer, the hole transport layer, the hole injection layer, and the anode are stacked adjacent to each other in the stated order.

The emitting layer in the organic electroluminescence device may be made of any of compounds that can be commonly used as a material of an emitting layer. The compound may be a low-molecular compound, a high-molecular compound, or a mixture thereof. The term "low-molecular material" herein means a material that is not a high-molecular material (polymer) and does not necessarily means an organic compound having a low molecular weight.

Examples of the high-molecular material of the emitting layer include polyacetylene-based compounds such as trans-polyacetylene, cis-polyacetylene, poly(di-phenylacetylene) (PDPA), and poly(alkyl, phenylacetylene) (PAPA); polyparaphenylenevinylene-based compounds such as poly (para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT) and poly(oxypropylene) triol (POPT); polyfluorene-based compounds such as poly (9,9-dialkylfluorene) (PDAF), poly(dioctylfluorene-alt-benzothiadiazole) (F8BT), α,ω-bis[N,N'-di(methylphenyl) aminophenyl]-poly[9,9-bis(2-ethylhexyl)fluorene-2,7-diyl] (PF2/6am4), and poly(9,9-dioctyl-2,7-divinylenefluorenyl)-ortho-co(anthracene-9,10-diyl); polyparaphenylene-based compounds such as poly(para-phenylene) (PPP) and poly(1, 5-dialkoxy-para-phenylene) (RO-PPP); polycarbazole-based compounds such as poly(N-vinylcarbazole) (PVK); polysilane-based compounds such as poly(methylphenylsilane) (PMPS), poly(naphthylphenylsilane) (PNPS), and poly (biphenylylphenylsilane) (PBPS); and boron compound-based polymer materials disclosed in Japanese Patent Application No. 2010-230995 and Japanese Patent Application No. 2011-6457.

Examples of the low-molecular material of the emitting layer include various metal complexes such as a tridentate iridium complex having 2,2'-bipyridine-4,4'-dicarboxylic acid as a ligand, fac-tris(2-phenylpyridine) iridium $(Ir(ppy)_3)$, 8-hydroxyquinoline aluminum $(Alq_3)$, tris(4-methyl-8-quinolinolate) aluminum(III) $(Almq_3)$, 8-hydroxyquinoline zinc $(Znq_2)$, (1,10-phenanthroline)-tris-(4,4,4-trifluoro-1-(2-thienyl)-butane-1,3-dionate) europium(III) (Eu $(TTA)_3$ (phen)), and 2,3,7,8,12,13,17,18-octaethyl-21H, 23H-porphin platinum(II); benzene-based compounds such as distyrylbenzene (DSB) and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxy imide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzoxazolethiophene; benzoxazole-based compounds such as benzoxazole; benzimidazole-based compounds such as benzimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spino-based compounds such as 2,2',7,7'-tetraphenyl-9,9'-spirobifluorene; metallic or non-metallic phthalocyanine-based compounds such as phthalocyanine $(H_2Pc)$ and copper phthalocyanine; and boron-based compound materials disclosed in JP-A 2009-155325, Japanese Patent Application No. 2010-230995, and Japanese Patent Application No. 2011-6458. Products available from Chemipro Kasei Kaisha, Ltd., such as KHLHS-04 and KHLDR-03 may be used.

The emitting layer may have any average thickness. The average thickness is preferably 10 to 150 nm, more preferably 20 to 100 nm, still more preferably 40 to 100 nm.

The average thickness of the emitting layer can be measured with a quartz crystal film thickness meter in the case of a low-molecular compound or with a stylus profiler in the case of a high-molecular compound.

The electron transport layer, if present, in the organic electroluminescence device may be made of any of compounds that can be commonly used as a material of an electron transport layer or may be made of a mixture of these compounds. Examples of the compounds that can be used as a material of an electron transport layer include pyridine derivatives such as tris-1,3,5-(3'-(pyridin-3"-yl)phenyl) benzene (TmPyPhB); quinoline derivatives such as (2-(3-(9-carbazolyl)phenyl)quinoline (mCQ)); pyrimidine derivatives such as 2-phenyl-4,6-bis(3,5-dipyridylphenyl) pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5]triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzinetriyl)-tris(1-phenyl-1-H-benzimidazole) (TPBI); aromatic ring tetracarboxylic anhydrides such as naphthalene and perylene; various metal complexes such as bis[2-(2-hydroxyphenyl) benzothiazolato]zinc ($Zn(BTZ)_2$) and tris(8-hydroxyquinolinato)aluminum ($Alq_3$); and organic silane derivatives typified by silole derivatives such as 2,5-bis(6'-(2',2"-bipyridyl))-1,1-dimethyl-3,4-diphenylsilole (PyPySPyPy). These may be used alone or in combination of two or more thereof. Products available from Chemipro Kasei Kaisha, Ltd., such as KHLHS-01 may be used.

Preferred among these are metal complexes such as $Alq_3$ and pyridine derivatives such as TmPyPhB.

The electron injection layer, if present, in the organic electroluminescence device may be made of a nitrogen-containing film layer including a nitrogen-containing compound.

Examples of the nitrogen-containing compound of the nitrogen-containing film layer include compounds containing a nitrogen-containing heterocycle, such as pyrrolidones (e.g., polyvinylpyrrolidone), pyrroles (e.g., polypyrrole), anilines (e.g., polyaniline), pyridines (e.g., polyvinylpyridine), pyrrolidines, imidazoles, piperidines, pyrimidines, and triazines; and amine compounds.

The nitrogen-containing compound is preferably a high nitrogen content compound such as a polyamine. A polyamine, which has a high proportion of the number of nitrogen atoms to the total number of atoms constituting the compound, is suitable to provide an organic electroluminescence device having high electron injection properties and high driving stability.

The polyamine is preferably one that can be formed into a layer by application, and may be a low-molecular compound or high-molecular compound. The low-molecular compound is preferably a polyalkylene polyamine such as diethylenetriamine or pentamethyldiethylenetriamine. The high-molecular compound is preferably a polymer having a polyalkyleneimine structure. Polyethyleneimine is particularly preferred. In particular, in a preferred embodiment of the present invention, the nitrogen-containing compound is polyethylenimine or diethylenetriamine.

The term "low-molecular compound" herein means a compound that is not a high-molecular compound (polymer) and does not necessarily mean a compound having a low molecular weight.

The nitrogen-containing film may have any average thickness. The average thickness is preferably 0.5 to 10 nm, more preferably 1 to 5 nm, still more preferably 1 to 3 nm.

The average thickness of the emitting layer can be measured with a quartz crystal film thickness meter in the case of a low-molecular compound.

The hole transport layer, if present, in the organic electroluminescence device may be made of an organic material having hole transport properties such as a p-type high-molecular material or p-type low-molecular material. The p-type high-molecular material and the p-type low-molecular material may be used alone or in combination. Examples of the p-type high-molecular material (organic polymer) include a polyarylamine, a fluorene-arylamine copolymer, a fluorene-bithiophene copolymer, poly(N-vinylcarbazole), polyvinylpyrene, polyvinylanthracene, polythiophene, a polyalkylthiophene, polyhexylthiophene, poly(p-phenylenevinylene), polythienylenevinylene, pyrene-formaldehyde resin, ethylcarbazole-formaldehyde resin, and derivatives thereof. Each of these compounds may be used as a mixture with other compounds. A mixture containing polythiophene may be exemplified by poly(3,4-ethylenedioxythiophene/styrenesulfonate) (PEDOT/PSS).

Examples of the p-type low-molecular material include arylcycloalkane-based compounds such as 1,1-bis(4-di-para-triaminophenyl) cyclohexane and 1,1'-bis(4-di-para-tolylaminophenyl)-4-phenyl-cyclohexane; arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine (α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene and 4-di-para-tolylaminostilbene; oxazole-based compounds such as OxZ; triphenylmethane-based compounds such as triphenylmethane and m-MTDATA; pyrazoline-based compounds such as 1-phenyl-3-(para-dimethylaminophenyl) pyrazoline; benzine (cyclohexadiene)-based compounds; triazole-based compounds such as triazole; imidazole-based compounds such as imidazole; oxadiazole-based compounds such as 1,3,4-oxadiazole and 2,5-di(4-dimethylaminophenyl)-1,3,4-oxadiazole; anthracene-based compounds such as anthracene and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo) fluorenone; aniline-based compounds such as polyaniline; silane-based compounds; pyrrole-based compounds such as 1,4-dithioketo-3,6-diphenyl-pyrrolo-(3,4-c)pyrrolopyrrole; fluorene-based compounds such as fluorene; porphyrin-based compounds such as porphyrin and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalen-1-yl)-N,N'-diphenyl-benzidine and N,N,N',N'-tetraphenylbenzidine.

The electron transport layer and the hole transport layer, if present, in the organic electroluminescence device may each have any average thickness. The average thickness of each layer is preferably 10 to 150 nm, more preferably 20 to 100 nm, still more preferably 40 to 100 nm.

The average thickness of each of the electron transport layer and the hole transport layer can be measured with a quartz crystal film thickness meter in the case of a low-molecular compound, or with a stylus profiler in the case of a high-molecular compound.

The metal oxide layer, if present, in the organic electroluminescence device may be present between the cathode and the emitting layer and/or between the anode and the emitting layer. Among these embodiments of the organic electroluminescence device of the present invention, the metal oxide layer is preferably present both between the cathode and the emitting layer and between the emitting layer and the anode. When the metal oxide layer between the cathode and the emitting layer is defined as a first metal oxide layer and the metal oxide layer between the anode and the emitting layer is defined as a second metal oxide layer, an exemplary preferred structure of the organic electroluminescence device of the present invention includes a laminate of the cathode, the first metal oxide layer, the electron injection layer and/or the electron transport layer, the emitting layer, the hole transport layer, the second metal oxide layer, and the anode, which are adjacent to each other in the stated order. An exemplary preferred structure of the organic electroluminescence device of the present invention, if including a nitrogen-containing film layer, includes a laminate of the cathode, the first metal oxide layer, the nitrogen-containing film layer, the emitting layer, the hole transport layer, the second metal oxide layer, and the anode, which are adjacent to each other in the stated order. An electron transport layer may optionally be present between the nitrogen-containing film layer and the emitting layer. As for the importance of the metal oxide layers, the first metal oxide layer is more important than the second metal oxide layer, and the second metal oxide layer may be replaced by, for example, an organic material having an extremely deep lowest unoccupied molecular orbital level such as HATCN.

The first metal oxide layer is a layer of a thin semiconductive or insulating film consisting of one single-metal oxide film, or a layer of thin semiconductive or insulating films consisting of a laminate and/or a mixture of single-metal oxides or multiple-metal oxides. The metal element of the metal oxide is selected from the group consisting of magnesium, calcium, strontium, barium, titanium, zirconium, hafnium, vanadium, niobium, tantalum, chromium, molybdenum, tungsten, manganese, indium, gallium, iron, cobalt, nickel, copper, zinc, cadmium, aluminum, and silicon. The layer consisting of a laminate or a mixture of metal oxides preferably includes a layer formed from at least one metal element selected from magnesium, aluminum, calcium, zirconium, hafnium, silicon, titanium, or zinc among the metal elements mentioned above. In the case of the layer consisting of single-metal oxides, the layer preferably includes a metal oxide selected from the group consisting of magnesium oxide, aluminum oxide, zirconium oxide, hafnium oxide, silicon oxide, titanium oxide, and zinc oxide.

Examples of the layer consisting of a laminate and/or a mixture of single-metal oxides or multiple-metal oxides include layers in which the following combinations of metal oxides are stacked and/or mixed: titanium oxide/zinc oxide, titanium oxide/magnesium oxide, titanium oxide/zirconium oxide, titanium oxide/aluminum oxide, titanium oxide/hafnium oxide, titanium oxide/silicon oxide, zinc oxide/magnesium oxide, zinc oxide/zirconium oxide, zinc oxide/hafnium oxide, zinc oxide/silicon oxide, calcium oxide/aluminum oxide, and the like. Examples thereof also include layers in which the following combinations of three kinds of metal oxides are stacked and/or mixed: titanium oxide/zinc oxide/magnesium oxide, titanium oxide/zinc oxide/zirconium oxide, titanium oxide/zinc oxide/aluminum oxide, titanium oxide/zinc oxide/hafnium oxide, titanium oxide/zinc oxide/silicon oxide, indium oxide/gallium oxide/zinc oxide, and the like. The above examples also include IGZO, an oxide semiconductor, and $12CaO \cdot 7Al_2O_3$, an electrode, which have special compositions and exhibit good properties.

The first metal oxide layer also serves as an electron injection layer or an electrode (cathode).

In the present invention, those having a sheet resistance of less than 100Ω/□ are classified as conductors, and those having a sheet resistance of not less than 100Ω/□ are classified as semiconductors or insulators. Thus, thin films known as transparent electrodes such as tin-doped indium oxide (ITO), antimony-doped indium oxide (ATO), indium-doped zinc oxide (IZO), aluminum-doped zinc oxide (AZO), and fluorine-doped indium oxide (FTO) thin films, which are highly conductive, do not fall into the category of the semiconductor or insulator and therefore do not meet the definition of a film constituting the first metal oxide layer.

The second metal oxide layer may be formed from any metal oxide, and examples thereof include vanadium oxide ($V_2O_5$), molybdenum oxide ($MoO_3$), tungsten oxide ($WO_3$), and ruthenium oxide ($RuO_2$). These may be used alone or in combination of two or more thereof. Among these, a metal oxide containing as a main component vanadium oxide or molybdenum oxide is preferred. The second metal oxide layer containing vanadium oxide or molybdenum oxide as a main component has an excellent function as a hole injection layer, i.e., a function to inject holes from the anode and transport the holes to the emitting layer or the hole transport layer. Also, vanadium oxide and molybdenum oxide inherently have high hole-transporting properties and thus have advantages that they can suitably prevent a decrease in injection efficiency of holes from the anode to the emitting layer or the hole transport layer. More preferably, the second metal oxide layer contains vanadium oxide and/or molybdenum oxide.

The first metal oxide layer may have an average thickness ranging from 1 nm to about several micrometers. In order to obtain an organic electroluminescence device that can operate at low voltages, the average thickness is preferably 1 to 1000 nm, more preferably 2 to 100 nm.

The second metal oxide layer may have any average thickness.

The average thickness is preferably 1 to 1000 nm, more preferably 5 to 50 nm.

The average thickness of the first metal oxide layer can be measured with a stylus profiler or by spectroscopic ellipsometry.

The average thickness of the second metal oxide layer can be measured with a quartz crystal film thickness meter during film formation.

The anode and the cathode in the organic electroluminescence device each may be formed from a known appropriate conductive material. In order to extract light, at least one of them is preferably transparent.

Examples of a known transparent conductive material include tin-doped indium oxide (ITO), antimony-doped indium oxide (ATO), indium-doped zinc oxide (IZO), aluminum-doped zinc oxide (AZO), and fluorine-doped indium oxide (FTO). Examples of an opaque conductive material include calcium, magnesium, aluminum, tin, indium, copper, silver, gold, and platinum, and alloys thereof.

The cathode is preferably made of ITO, IZO, or FTO among these.

The anode is preferably made of Au, Ag, or Al among these.

Since metals commonly used for an anode can be used for the cathode and the anode as described above, a top emission structure in which light is extracted from the upper electrode can be readily achieved, and each electrode can be selected from the above various types of electrodes. For example, Al may be used for the lower electrode and ITO may be used for the upper electrode.

The cathode may have any average thickness. The average thickness is preferably 10 to 500 nm, more preferably 100 to 200 nm. The average thickness of the cathode can be measured with a stylus profiler or by spectroscopic ellipsometry.

The anode may have any average thickness. The average thickness is preferably 10 to 1000 nm, more preferably 30 to 150 nm. An opaque material can be used as an anode for the top emission type device and the transparent type device when the average thickness of the opaque material is about 10 to 30 nm, for example.

The average thickness of the anode can be measured with a quartz crystal film thickness meter during film formation.

In the organic electroluminescence device of the present invention, the organic electroluminescence device that includes a metal oxide layer between the cathode and the emitting layer and includes a laminate structure in which a layer of a metal compound having a surface energy of 60 dyne/cm or higher, an elemental metal layer, a metal oxide layer, and an organic compound layer are stacked in the stated order from the cathode-side end is one of the preferred embodiment of the organic electroluminescence device of the present invention. The device including these layers stacked in the stated order adjacent to each other can provide the following effects.

A device including an elemental metal as an electrode can be driven with lower power than a device including ITO as an electrode. Since the device of the present invention is an inverted device in which the cathode is formed on a substrate, on a cathode side, the elemental metal layer is formed on the layer of a metal compound having a surface energy of 60 dyne/cm or higher in the production of the device. The elemental metal layer formed on such a layer of a metal compound having a high surface energy can be a uniform, thin film. Also, owing to the layer of a metal compound having a surface energy of 60 dyne/cm or higher, high conductivity can be achieved even when the elemental metal layer is thin. Thus, the elemental metal layer can provide a thinner electrode than ITO, leading to an electrode with excellent flexibility. Further, light reflected by the elemental metal layer can be reduced by disposing the elemental metal layer between layers having a high refractive index, providing a highly transparent electrode.

The metal compound having a surface energy of 60 dyne/cm or higher forming the end of the cathode-side laminate structure is preferably a metal compound having a surface energy of 65 dyne/cm or higher, more preferably a metal compound having a surface energy of 70 dyne/cm or higher. On a layer of such a metal compound can be formed a more uniform, thin elemental metal layer.

The metal compound having a surface energy of 60 dyne/cm or higher preferably includes an oxide and/or sulfide of a metal element selected from Zn, Mo, Ti, Mg, Ce, Al, Fe, or Zr. Such a metal compound, which can be easily formed into a thin film and is easily available, is suitable as a material of the organic electroluminescence device. The metal compound more preferably includes an oxide and/or sulfide of a metal element selected from Zn, Mo, Ti, or Mg, still more preferably includes an oxide and/or sulfide of a metal element selected from Zn or Mo.

The layer of a metal compound having a surface energy of 60 dyne/cm or higher preferably has an average thickness of 1 to 1000 nm. The average thickness is more preferably 5 to 100 nm, still more preferably 10 to 50 nm.

The elemental metal layer as the cathode of the organic electroluminescence device is preferably a layer of an elemental metal selected from the group consisting of Ag, Al, Au, Cu, W, Co, Ni, Zn, K, Li, Fe, Pt, Sn, Cr, Pb, Ti, Mn, and Pd. The organic electroluminescence device of the present invention including any of these elemental metals can be driven at lower voltage. More preferred is a layer of an elemental metal selected from the group consisting of Ag, Al, Au, Cu, W, Co, Ni, and, Zn, and still more preferred is a layer of an elemental metal selected from the group consisting of Ag, Al, Au, and Cu.

The elemental metal layer as the cathode of the organic electroluminescence device preferably has an average thickness of 1 to 100 nm. The average thickness is more preferably 5 to 50 nm, still more preferably 7 to 25 nm.

When the organic electroluminescence device of the present invention includes a metal oxide layer between the cathode and the emitting layer and includes a laminate structure in which a layer of a metal compound having a surface energy of 60 dyne/cm or higher, an elemental metal layer, a metal oxide layer, and an organic compound layer are stacked in the stated order from the cathode-side end of the laminate structure, the metal oxide layer in the cathode-side laminate structure is preferably a layer of a metal oxide having a work function of 3.5 or more. Use of such a metal oxide can provide a layer serving as a transparent electrode and having electron-injection property. More preferred is a layer of a metal oxide having a work function of 4.0 or more, and still more preferred is a layer of a metal oxide having a work function of 4.0 or more and 5.0 or less.

Examples of the metal oxide having a work function of 3.5 or more include ZnO, MgO, $MoO_3$, $TiO_2$, $Al_2O_3$, FeO, $ZrO_2$, tin-doped indium oxide (ITO), antimony-doped indium oxide (ATO), indium-doped zinc oxide (IZO), aluminum-doped zinc oxide (AZO), and fluorine-doped indium oxide (FTO). Preferred is a metal oxide having a work function of 4.0 or more, such as ZnO, MgO, $MoO_3$, $TiO_2$, $ZrO_2$, ITO, ATO, IZO, AZO, or FTO, and more preferred is a metal oxide having a work function of 4.0 or more and 5.0 or less, such as ZnO, MgO, ITO, ATO, IZO, AZO, or FTO, among these.

The metal oxide layer in the cathode-side laminate structure preferably has an average thickness of 1 to 100 nm. The average thickness is more preferably 1 to 50 nm, still more preferably 1 to 25 nm.

Alternatively, the organic electroluminescence device of the present invention may include a laminate structure in which a metal oxide layer, an elemental metal layer, a layer of a metal compound having a surface energy of 60 dyne/cm or higher, and an organic compound layer are stacked in the stated order from the anode-side end of the laminate structure. The organic electroluminescence device having such a structure is one of the preferred embodiment of the organic electroluminescence device of the present invention. The device including these layers adjacent to each other on the anode side in addition to the cathode-side laminate structure can be driven at lower voltage and can be highly transparent.

When such a laminate structure is present on the anode side, the specific examples, preferred structures, and average thicknesses of the layer of a metal compound having a surface energy of 60 dyne/cm or higher and the elemental metal layer (anode layer) on the anode side in the laminate structure are the same as those of the layer of a metal compound having a surface energy of 60 dyne/cm or higher and the elemental metal layer (cathode layer) on the cathode side in the cathode-side laminate structure.

When the organic electroluminescence device of the present invention includes the above-described laminate structure on the anode side, the metal oxide layer on the anode side is preferably a layer of a metal oxide having a work function of 3.5 or more. Use of such a metal oxide can provide a layer serving as a transparent electrode and having hole-injection property. More preferred is a layer of a metal oxide having a work function of 4.0 or more, and still more preferred is a layer of a metal oxide having a work function of 4.5 or more.

Examples of the metal oxide having a work function of 3.5 or more include ZnO, MgO, MoO$_3$, TiO$_2$, Al$_2$O$_3$, FeO, ZrO$_2$, ITO, ATO, IZO, AZO, and FTO. Preferred is a metal oxide having a work function of 4.0 or more, such as ZnO, MgO, MoO$_3$, TiO$_2$, ZrO$_2$, ITO, ATO, IZO, AZO, or FTO, and more preferred is a metal oxide having a work function of 4.5 or more, such as MgO, MoO$_3$, or TiO$_2$.

The metal oxide layer on the anode side preferably has an average thickness of 1 to 100 nm. The average thickness is more preferably 1 to 50 nm, still more preferably 1 to 25 nm.

When the organic electroluminescence device of the present invention does not include the above-described anode-side laminate structure, the device preferably includes a laminate structure on the anode side in which an anode is present at the end of the laminate structure and a metal oxide layer is present between the anode and the organic compound layer. In this case, the anode may be Au, Ag, or Al, for example, and the average thickness of the anode is preferably, but not limited to, 10 to 1000 nm, more preferably 30 to 150 nm. The metal oxide of the metal oxide layer between the anode and the organic compound layer may have a work function of 3.5 or more, for example, and the average thickness of the metal oxide layer is preferably, but not limited to, 1 to 1000 nm, more preferably 5 to 50 nm.

The organic compound layer in the organic electroluminescence device of the present invention may be formed by any method. An appropriate method may be selected from various methods according to the properties of the material. When the material can be applied in the form of a solution, various application methods can be employed such as spin coating, casting, micro gravure coating, gravure coating, bar coating, roll coating, wire bar coating, slit coating, dip coating, spray coating, screen printing, flexographic printing, offset printing, and inkjet printing. In order to more easily control the film thickness, spin coating and slit coating are preferred among these. When the material is not applied or is less soluble in a solvent, vacuum deposition, chemical vapor deposition (CVD), and evaporative spray deposition from ultra-dilute solution (ESDUS) are suitable, for example.

When the organic compound layer(s) is formed by applying an organic compound solution, inorganic solvents and various organic solvents can be used to dissolve the organic compound. Examples of the inorganic solvents include nitric acid, sulfuric acid, ammonia, hydrogen peroxide, water, carbon disulfide, carbon tetrachloride, and ethylene carbonate. Examples of the organic solvents include ketone solvents such as methyl ethyl ketone (MEK), acetone, diethyl ketone, methyl isobutyl ketone (MIBK), methyl isopropyl ketone (MIPK), and cyclohexanone; alcohol solvents such as methanol, ethanol, isopropanol, ethylene glycol, diethylene glycol (DEG), and glycerol; ether solvents such as diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), and diethylene glycol ethyl ether (carbitol); cellosolve solvents such as methyl cellosolve, ethyl cellosolve, and phenyl cellosolve; aliphatic hydrocarbon solvents such as hexane, pentane, heptane, and cyclohexane; aromatic hydrocarbon solvents such as toluene, xylene, and benzene; aromatic heterocyclic compound solvents such as pyridine, pyrazine, furan, pyrrole, thiophene, and methylpyrrolidone; amide solvents such as N,N-dimethylformamide (DMF) and N,N-dimethylacetamide (DMA); halogenated compound solvents such as chlorobenzene, dichloromethane, chloroform, and 1,2-dichloroethane; ester solvents such as ethyl acetate, methyl acetate, and ethyl formate; sulfur compound solvents such as dimethyl sulfoxide (DMSO) and sulfolane; nitrile solvents such as acetonitrile, propionitrile, and acrylonitrile; and organic acid solvents such as formic acid, acetic acid, trichloroacetic acid, and trifluoroacetic acid. Examples also include mixtures of these solvents.

Preferred among these solvents are non-polar solvents, and examples thereof include aromatic hydrocarbon solvents such as xylene, toluene, cyclohexylbenzene, dihydrobenzofuran, trimethylbenzene, and tetramethylbenzene, aromatic heterocyclic compound solvents such as pyridine, pyrazine, furan, pyrrole, thiophene, and methylpyrrolidone, and aliphatic hydrocarbon solvents such as hexane, pentane, heptane, and cyclohexane. These may be used alone or as a mixture of two or more thereof.

The cathode, the anode, and the oxide layer can be formed by methods such as sputtering, vacuum deposition, a sol-gel method, spray pyrolysis deposition (SPD), atomic layer deposition (ALD), vapor phase deposition, or liquid phase deposition. The cathode and the anode may also be formed by joining metal foil. A method suitable for each layer may be selected from these methods according to the properties of the material of the layer, and the layers may be formed by different methods. The second metal oxide layer is more preferably formed by vapor phase deposition among these methods. The vapor phase deposition enables clean formation of the second metal oxide layer in good contact with the anode without destroying the surface of the organic compound layer. As a result, the effects owing to the presence of the second metal oxide layer as described above are more significantly achieved.

In order to further enhance the properties of the organic electroluminescence device, the organic electroluminescence device may further include, if necessary, other layers such as a hole blocking layer and an electron blocking layer. These layers may be made of any of materials commonly used for these layers and may be formed by a method commonly used to form these layers.

The organic electroluminescence device of the present invention, which is an inverted organic electroluminescence device highly resistant to degradation by oxygen or moisture, can employ a thin substrate having low barrier properties. The organic electroluminescence device of the present invention having a combination of such a device and an ultra-thin substrate has a smaller thickness and better flexibility than existing organic electroluminescence devices. Such a device can be used for display devices such as displays of TVs and mobiles and lighting systems. The device can also be used for cosmetic tools and medical devices used by applying the device to the skin in order to obtain cosmetic effects and therapeutic effects. Such display device, lighting system, cosmetic tool, and medical device each including the organic electroluminescence device of the present invention is also encompassed by the present invention.

EXAMPLES

The present invention is described in more detail with reference to examples below, but the present invention is not limited to these examples. Herein, "part(s)" means "part(s) by weight" and "%" means "% by mass" unless otherwise stated.

1. Production of Substrate

Synthesis Example 1

Production of 1.5-µm-Thick SU-8 Substrate and Production of ITO

[0-11] A glass substrate was ultrasonically washed using Semico Clean (Furuuchi Chemical Corporation), followed by oxygen plasma cleaning.

[0-21] To a surface of the glass substrate was applied Novec 1700 (fluorine acrylic coating agent available from 3M) by spin coating at 2000 rpm for 30 seconds to form a film.

[0-31] The glass substrate on which the film of Novec 1700 was formed was used as a supporting substrate. On the surface of the substrate was formed a 1.5-µm-thick film by spin-coating SU-8 (photoresist available from microchem). The resulting workpiece was UV-crosslinked, followed by annealing on an electric griddle at 95° C. for three minutes. Thus, a substrate 101 was produced.

[0-41] Next, a transparent electrode layer was formed as follows. The substrate 101 was fixed to a substrate holder of a sputtering apparatus with an ITO target. Sputtering was performed while introducing oxygen to form an ITO electrode having a thickness of about 70 nm. The transparent electrode formed was patterned by photolithography.

The average thickness of each of the SU-8 film, the ITO electrode layer, and the substrate was measured with a stylus profiler.

Synthesis Example 2

Production of 0.1-µm-Thick Parylene Substrate and Production of ITO

[0-12] A glass substrate was ultrasonically washed using Semico Clean (Furuuchi Chemical Corporation), followed by oxygen plasma cleaning.

[0-22] To a surface of the glass substrate was applied Novec 1700 by spin coating at 2000 rpm for 30 seconds to form a film.

[0-32] The glass substrate on which the film of Novec 1700 was formed was used as a supporting substrate. On the surface of the substrate was formed a 0.1-µm-thick parylene film using diX-SR (Daisan Kasei Co., Ltd.) as a raw material by CVD with Labcoter PDS-2010 (Parylene Japan, LLC). The resulting workpiece was annealed on an electric griddle at 180° C. for 30 minutes in a nitrogen atmosphere. Thus, a substrate 102 was produced.

[0-42] Next, a transparent electrode layer was formed as follows. The substrate 102 was fixed to a substrate holder of a sputtering apparatus with an ITO target. Sputtering was performed while introducing oxygen to form an ITO electrode having a thickness of about 70 nm. The transparent electrode formed was patterned by photolithography.

The average thickness of each of the parylene film, the ITO electrode layer, and the substrate was measured with a stylus profiler.

Synthesis Example 3

Production of 1-µm-Thick Polyimide Substrate and Production of ITO

[0-13] A glass substrate was ultrasonically washed using Semico Clean (Furuuchi Chemical Corporation), followed by oxygen plasma cleaning.

[0-23] To a surface of the glass substrate was applied Novec 1700 (fluorine acrylic coating agent available from 3M) by spin coating at 2000 rpm for 30 seconds to form a film.

[0-33] The glass substrate on which the film of Novec 1700 was formed was used as a supporting substrate. On the surface of the substrate was formed a 1-µm-thick film by spin coating CT4112 (polyimide available from KYOCERA Chemical Corporation). The resulting workpiece was baked in an inert oven at 180° C. for 60 minutes. Thus, a substrate 103 was produced.

[0-43] Next, a transparent electrode layer was formed as follows. The substrate 103 was fixed to a substrate holder of a sputtering apparatus with an ITO target. Sputtering was performed while introducing oxygen to form an ITO electrode having a thickness of about 70 nm. The transparent electrode formed was patterned by photolithography.

The average thickness of each of the CT4112 film, the ITO electrode layer, and the substrate was measured with a stylus profiler.

2. Production of Organic Electroluminescence Device and Evaluation of Properties Thereof Example 1

[1] The film substrate 101 with an ITO electrode layer (cathode 2) produced in Synthesis Example 1 was subjected to UV-ozone cleaning for 20 minutes.

[2] After the cleaning, the substrate was fixed again to a substrate holder of a mirrortron sputtering apparatus with a zinc metal target. The pressure was reduced to about $5 \times 10^{-5}$ Pa, and then sputtering was performed while introducing argon and oxygen. Thus, a zinc oxide layer having a thickness of about 2 nm was produced as a metal oxide layer 3.

In this step, a metal mask was used to prevent formation of a zinc oxide film on part of the ITO electrode for leading out electrode.

[3] Next, an organic buffer layer 4 was formed as follows. A 0.1% by mass dilution of polyethyleneimine (EPOMIN (registered trademark)) available from Nippon Shokubai Co., Ltd. in ethanol was spin-coated at 2000 rpm for 30 seconds. EPOMIN used was P1000 having a molecular weight of 70000. The thickness of the layer was measured by X-ray photoelectric spectroscopy and found to be about 1 nm.

[4] The substrate treated in the step [3] was introduced into a vacuum apparatus, and the pressure was reduced to $5 \times 10^{-5}$ Pa or lower. Then, 15 nm-thick KHLHS-01 as an electron transport layer 5, 30 nm-thick α-NPD:KHLHS-04: KHLDR-03 as an emitting layer 6, and 24 nm-thick α-NPD as a hole transport layer 7 were stacked in the stated order by vacuum deposition.

[5] Next, a hole injection layer 8 was formed on the hole transport layer 7. Specifically, a 10-nm-thick molybdenum oxide film was formed by vacuum deposition as vapor deposition.

[6] Next, an anode 9 was formed on the hole injection layer 8 as a final step. Specifically, a 100-nm-thick aluminum film was formed by vacuum deposition.

[7] Finally, a 1-μm-thick parylene film was formed as a sealing layer 10 using diX-SR (Daisan Kasei Co., Ltd.) as a raw material by CVD with Labcoter PDS-2010 (Parylene Japan, LLC). After sealing, the resulting device was removed from the supporting substrate.

Through the steps [1] to [7], an organic electroluminescence device 51 was produced (FIG. 1). The device 51 of Example 1 had a thickness of 2.75 μm.

Figure 3:
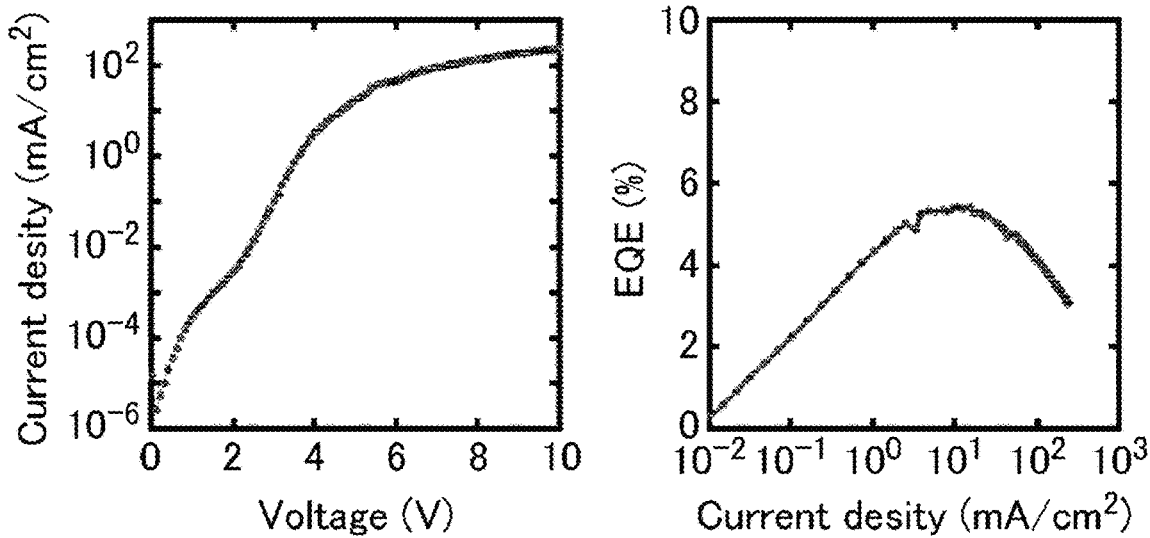
FIG. 3 is a view showing the voltage-current density characteristics and the current density-external quantum efficiency characteristics of an organic electroluminescence device obtained in Example 1.
Figure 4:
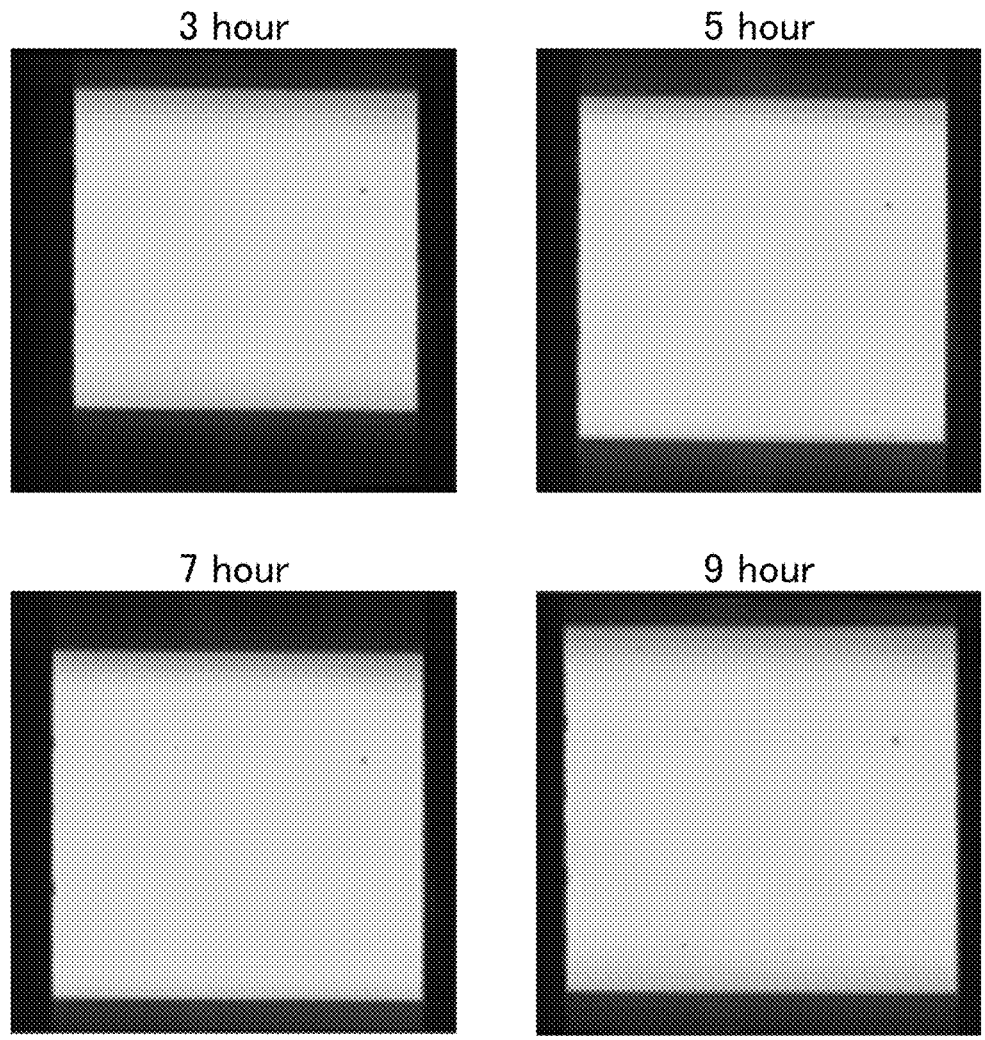
FIG. 4 is a view of images showing the change over time of emission of the organic electroluminescence device obtained in Example 1.

[8] The current density-external quantum efficiency characteristics of the organic electroluminescence device 51 were evaluated according to the process <Measurement of luminescence properties of organic electroluminescence device> described below. The voltage-current density characteristics were also evaluated. The results are shown in FIG. 3. The change over time of emission was observed. The results are shown in FIG. 4.

<Measurement of Luminescence Properties of Organic Electroluminescence Device>

A voltage was applied and the current was measured with "2400 SourceMeter" available from Keithley. The luminance was measured with "light distribution measurement system C9920-11" available from Hamamatsu Photonics K.K.

Example 2

An organic electroluminescence device 52 was produced as in Example 1 except that the steps [1], [7], and [8] in Example 1 were changed to the below-described steps [1-2], [7-2], and [8-2], respectively.

[1-2] The film substrate 102 with an ITO electrode layer (cathode 2) produced in Synthesis Example 2 was subjected to UV-ozone cleaning for 20 minutes.

[7-2] Finally, a 0.1-μm-thick parylene film was formed as a sealing layer 10 using diX-SR (Daisan Kasei Co., Ltd.) as a raw material by CVD with Labcoter PDS-2010 (Parylene Japan, LLC). After sealing, the resulting device was removed from the supporting substrate.

Through the steps [1] to [7-2], the organic electroluminescence device 52 was produced (FIG. 1). The device 52 of Example 2 had a thickness of 0.45 μm.

Figure 6:
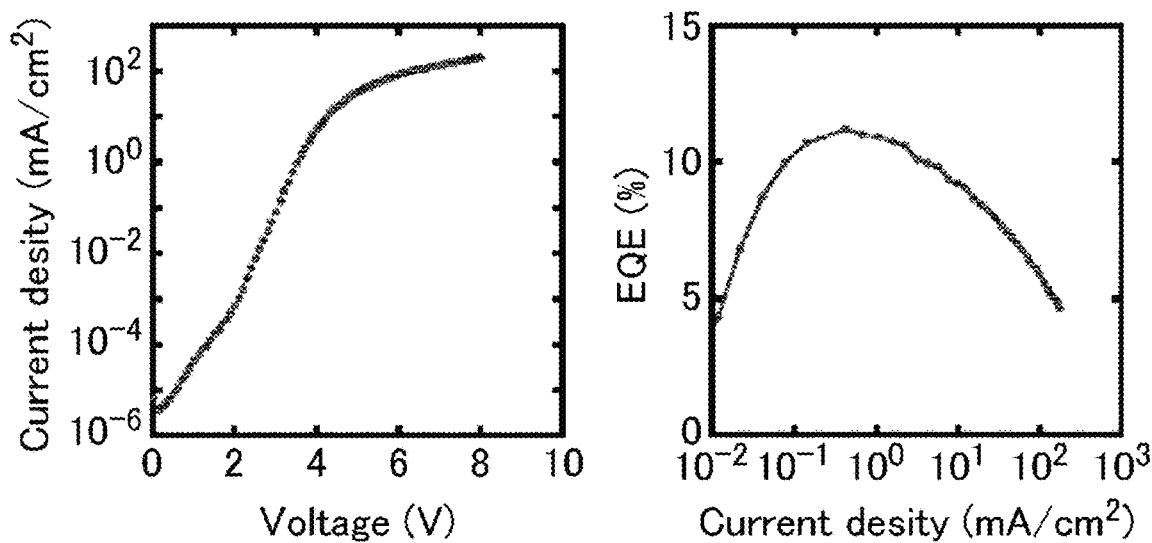
FIG. 6 is a view showing the voltage-current density characteristics and the current density-external quantum efficiency characteristics of an organic electroluminescence device obtained in Example 2.

[8-2] The current density-external quantum efficiency characteristics of the organic electroluminescence device 52 were evaluated according to the process <Measurement of luminescence properties of organic electroluminescence device>. The voltage-current density characteristics were also evaluated. The results are shown in FIG. 6.

Comparative Example 1

[1-3] The film substrate 101 with an ITO electrode layer (anode 9) produced in Synthesis Example 1 was subjected to UV-ozone cleaning for 20 minutes.

[2-3] The substrate treated in the step [1-3] was introduced into a vacuum apparatus, and the pressure was reduced to $5 \times 10^{-5}$ Pa or lower. Then, 10 nm-thick molybdenum oxide as the hole injection layer 8, 24 nm-thick α-NPD as the hole transport layer 7, 30 nm-thick α-NPD: KHLHS-04:KHLDR-03 as the emitting layer 6, and 15 nm-thick KHLHS-01 as the electron transport layer 5 were stacked by vacuum deposition.

[3-3] Then, an electron injection layer 11 was formed. Specifically, a 1 nm-thick sodium fluoride layer was formed by vacuum deposition as vapor deposition.

[4-3] Next, a cathode 2 was formed on the electron injection layer 11 as a final step. Specifically, a 100 nm-thick aluminum film was formed by vacuum deposition.

[5-3] Finally, a 1-μm-thick parylene film was formed as a sealing layer 10 using diX-SR (Daisan Kasei Co., Ltd.) as a raw material by CVD with Labcoter PDS-2010 (Parylene Japan, LLC). After sealing, the resulting device was removed from the supporting substrate.

Through the steps [1-3] to [5-3], an organic electroluminescence device 53 was produced. The device 53 of Comparative Example 1 had a thickness of 2.75 μm.

Figure 5:
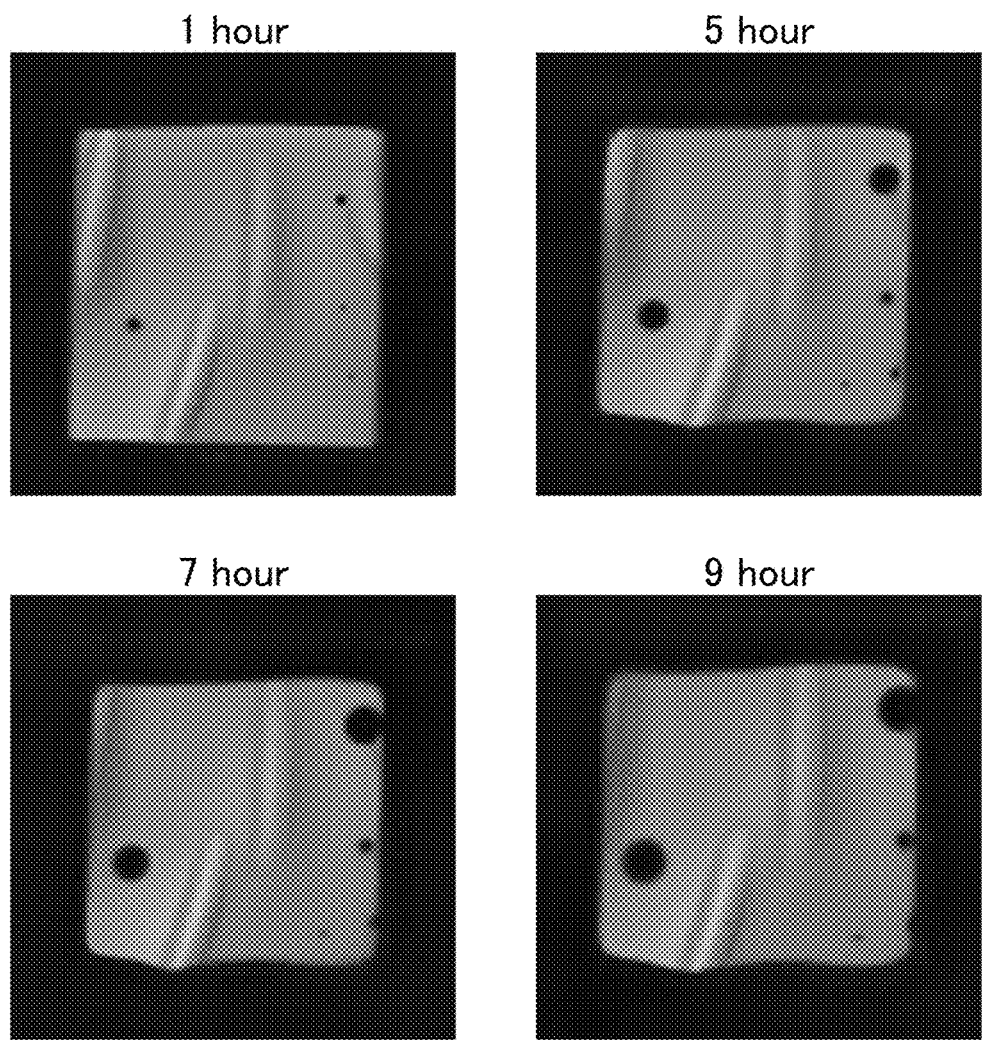
FIG. 5 is a view of images showing the change over time of emission of the organic electroluminescence device obtained in Comparative Example 1.

[6-3] The change over time of emission of the organic electroluminescence device 53 was observed. The results are shown in FIG. 5.

FIG. 3 demonstrates that emission can be obtained with an efficiency that does not cause any problem in use. Also, FIG. 4 shows stable emission in which few dark spots are observed. In contrast, in FIG. 5 which shows the change over time of emission of the existing organic electroluminescence device 53 including the same substrate and sealing structure as those in Example 1, the growth of dark spots is clearly observed, which indicates that continuous use of the device 53 with stability is difficult. Although the measurement was performed for nine hours, the dark spots had already been grown in five hours. This presumably indicates that use of the device for even several hours is difficult. This demonstrates that the structures including as components and thicknesses of the components of the organic electroluminescence device of the present invention are suitable for providing a device capable of following any curvilinear surface and continuously using light with stability.

Further, FIG. 6, which shows the results of Example 2, demonstrates that the device having a smaller thickness can provide emission with an efficiency that does not cause any problem in use as in Example 1. Also, with respect to the change over time, the same results as in the Example were obtained. These demonstrate that the device of the present invention can be used as a device having a smaller thickness, higher followability, and higher adhesion.

REFERENCE SIGNS LIST

2: cathode
3: metal oxide layer
4: organic buffer layer
5: electron transport layer
6: emitting layer
7: hole transport layer
8: hole injection layer
9: anode
10: sealing layer
11: electron injection layer
101: 1.5-μm-thick substrate
102: 0.1-μm-thick substrate

The invention claimed is:

1. An organic electroluminescence device having a structure comprising:
   an anode;
   a cathode on a substrate; and
   a laminate of multiple layers between the anode and the cathode, and
   a laminate structure including a metal oxide layer, an elemental metal layer, a layer of a metal compound having a surface energy of 60 dyne/cm or higher, and an organic compound layer stacked in the stated order from an anode-side end of the laminate structure,
   the device having a thickness of smaller than 10 μm.

2. The organic electroluminescence device according to claim 1,
   wherein the substrate is a single layer.

3. The organic electroluminescence device according to claim 2,
   wherein the substrate is a single layer of a para-xylylene-based polymer film.

4. A display device comprising the organic electroluminescence device according to claim 1.

5. A lighting system comprising the organic electroluminescence device according to claim 1.

6. The organic electroluminescence device according to claim 1, further comprising a second laminate structure including a layer of a metal compound having a surface energy of 60 dyne/cm or higher, an elemental metal layer, a metal oxide layer, and an organic compound layer stacked in the stated order from a cathode-side end of the laminate.

7. The organic electroluminescence device according to claim 6,
   wherein the substrate is a single layer.

8. The organic electroluminescence device according to claim 7,
   wherein the substrate is a single layer of a para-xylylene-based polymer film.

9. A display device comprising the organic electroluminescence device according to claim 6.

10. A lighting system comprising the organic electroluminescence device according to claim 6.

11. The organic electroluminescence device according to claim 1, wherein the metal compound having a surface energy of 60 dyne/cm or higher includes an oxide and/or sulfide of a metal element selected from Zn, Mo, Ti, Mg, Ce, Al, Fe, or Zr.

12. The organic electroluminescence device according to claim 1, wherein the layer of the metal compound having a surface energy of 60 dyne/cm or higher has an average thickness of 1 to 1000 nm.

13. The organic electroluminescence device according to claim 1, wherein the elemental metal layer is a layer of an elemental metal selected from the group consisting of Ag, Al, Au, Cu, W, Co, Ni, Zn, K, Li, Fe, Pt, Sn, Cr, Pb, Ti, Mn, and Pd.

14. The organic electroluminescence device according to claim 1, wherein the elemental metal layer has an average thickness of 1 to 100 nm.

15. The organic electroluminescence device according to claim 1, wherein the metal oxide layer include ZnO, MgO, $MoO_3$, $TiO_2$, $Al_2O_3$, FeO, $ZrO_2$, tin-doped indium oxide (ITO), antimony-doped indium oxide (ATO), indium-doped zinc oxide (IZO), aluminum-doped zinc oxide (AZO), and fluorine-doped indium oxide (FTO).

16. The organic electroluminescence device according to claim 1, wherein the metal oxide layer has an average thickness of 1 to 100 nm.

* * * * *